United States Patent
Aggarwal et al.

(10) Patent No.: US 7,153,706 B2
(45) Date of Patent: Dec. 26, 2006

(54) FERROELECTRIC CAPACITOR HAVING A SUBSTANTIALLY PLANAR DIELECTRIC LAYER AND A METHOD OF MANUFACTURE THEREFOR

(75) Inventors: Sanjeev Aggarwal, Plano, TX (US); Kelly J. Taylor, Allen, TX (US); Lindsey Hall, Plano, TX (US); Satyavolu Srinivas Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/829,053

(22) Filed: Apr. 21, 2004

(65) Prior Publication Data
US 2005/0239218 A1   Oct. 27, 2005

(51) Int. Cl.
*H01L 21/00* (2006.01)
(52) U.S. Cl. .................... 438/3; 438/240; 438/633
(58) Field of Classification Search .................. 438/3, 438/240, 253, 626, 633
See application file for complete search history.

(56) References Cited

U.S. PATENT DOCUMENTS

| | | | | |
|---|---|---|---|---|
| 5,855,811 A * | 1/1999 | Grieger et al. | ............. | 252/79.3 |
| 6,232,174 B1 * | 5/2001 | Nagata et al. | ............. | 438/253 |
| 6,239,457 B1 * | 5/2001 | Suenaga et al. | ............. | 257/295 |
| 6,338,970 B1 * | 1/2002 | Suh | ............. | 438/3 |
| 6,395,194 B1 | 5/2002 | Russell et al. | | |
| 6,635,528 B1 | 10/2003 | Gilbert et al. | | |
| 2001/0044205 A1 * | 11/2001 | Gilbert et al. | ............. | 438/653 |
| 2002/0003123 A1 * | 1/2002 | Lee et al. | ............. | 216/6 |

\* cited by examiner

*Primary Examiner*—Chandra Chaudhari
(74) *Attorney, Agent, or Firm*—Jacqueline J. Garner; W. James Brady, III; Frederick J. Telecky, Jr.

(57) ABSTRACT

The present invention provides a ferroelectric capacitor, a method of manufacture therefor, and a method of manufacturing a ferroelectric random access memory (FeRAM) device. The ferroelectric capacitor (100), among other elements, includes a substantially planar ferroelectric dielectric layer (165) located over a first electrode layer (160), wherein the substantially planar ferroelectric dielectric layer (165) has an average surface roughness of less than about 4 nm. The ferroelectric capacitor (100) further includes a second electrode layer (170) located over the substantially planar ferroelectric dielectric layer (165).

26 Claims, 9 Drawing Sheets

FERROELECTRIC CAPACITOR HAVING A SUBSTANTIALLY PLANAR DIELECTRIC LAYER AND A METHOD OF MANUFACTURE THEREFOR

TECHNICAL FIELD OF THE INVENTION

The present invention is directed, in general, to a ferroelectric capacitor and, more specifically, to a ferroelectric capacitor having a substantially planar dielectric layer, a method of manufacture therefor, and a method of manufacturing a ferroelectric random access memory (FeRAM) device.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its only supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has memory and logic functions integrated onto the same semiconductor chip. Preferably, this memory will be configured such that if the battery dies, the contents of the memory will be retained. Such a memory device which retains its contents while power is not continuously applied to it is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for a FeRAM. The memory size and memory architecture affects the read and write access times of a FeRAM.

The non-volatility of an FeRAM is due to the bistable characteristic of the ferroelectric memory cell. Two types of memory cells are used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is believed to be more stable than a 1C memory cell.

In a 1T/1C FeRAM cell there is one transistor and one storage capacitor. The bottom electrode of the storage capacitor is connected to the drain of the transistor. The 1T/1C cell is read from by applying a signal to the gate of the transistor (wordline) thereby connecting the bottom electrode of the capacitor to the source of the transistor (bitline). A pulse signal is then applied to the top electrode contact (plate line or drive line). The potential on the bitline of the transistor is, therefore, the capacitor charge divided by the bitline capacitance. Since the capacitor charge is dependent upon the bistable polarization state of the ferroelectric material, the bitline potential can have two distinct values. A sense amplifier is connected to the bitline and detects the voltage associated with a logic value of either 1 or 0. Frequently the sense amplifier reference voltage is a ferroelectric or non-ferroelectric capacitor connected to another bitline that is not being read. In this manner, the memory cell data is retrieved.

A characteristic of a ferroelectric memory is that a read operation is destructive in some applications. The data in a memory cell must be rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. If the drive line voltage was small enough not to switch the ferroelectric then the read operation was not destructive. In general a non-destructive read requires a much larger capacitor than a destructive read and, therefore, requires a larger cell size.

A 2T/2C memory cell, on the other hand, comprises two transistors and two ferroelectric capacitors. A first transistor couples between the bitline and a first capacitor. A second transistor couples between the bitline-bar and a second capacitor. The first and second capacitors have a common terminal or plate to which a signal is applied for polarizing the capacitors.

In a write operation, the first and second transistors of the dual capacitor ferroelectric memory cell are enabled to couple the capacitors to the complementary logic levels on the bitline and the bitline-bar line corresponding to a logic state to be stored in memory. The common terminal of the capacitors is pulsed during a write operation to polarize the dual capacitor memory cell to one of the two logic states.

In a read operation, the first and second transistors of the dual capacitor memory cell are enabled to couple the information stored on the first and second capacitors to the bitline and the bitline-bar line. A differential signal is generated across the bitline and the bitline-bar line by the dual capacitor memory cell. The differential signal is sensed by a sense amplifier which provides a signal corresponding to the logic level stored in memory.

The FeRAMs have a multitude of benefits over other memory device alternatives, however, FeRAMs still currently have some drawbacks. One known drawback is the lack of planarity of the ferroelectric capacitor that comprises the FeRAM capacitors.

Accordingly, what is needed in the art is a ferroelectric capacitor and a FeRAM that do not experience the lack of planarity issues experienced by the prior art devices.

SUMMARY OF THE INVENTION

To address the above-discussed deficiencies of the prior art, the present invention provides a ferroelectric capacitor, a method of manufacture therefor, and a method of manufacturing a ferroelectric random access memory (FeRAM) device. The ferroelectric capacitor, among other elements, includes a substantially planar ferroelectric dielectric layer located over a first electrode layer, wherein the substantially planar ferroelectric dielectric layer has an average surface roughness of less than about 4 nm. The ferroelectric capacitor further includes a second electrode layer located over the substantially planar ferroelectric dielectric layer.

As mentioned above, the present invention further provides a method for manufacturing the ferroelectric capacitor. The method for manufacturing a ferroelectric capacitor may include forming a first electrode layer and forming a ferroelectric dielectric layer over the first electrode layer. The method further includes planarizing the ferroelectric dielectric layer to form a planarized ferroelectric dielectric layer, and forming a second electrode layer over the planarized ferroelectric dielectric layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
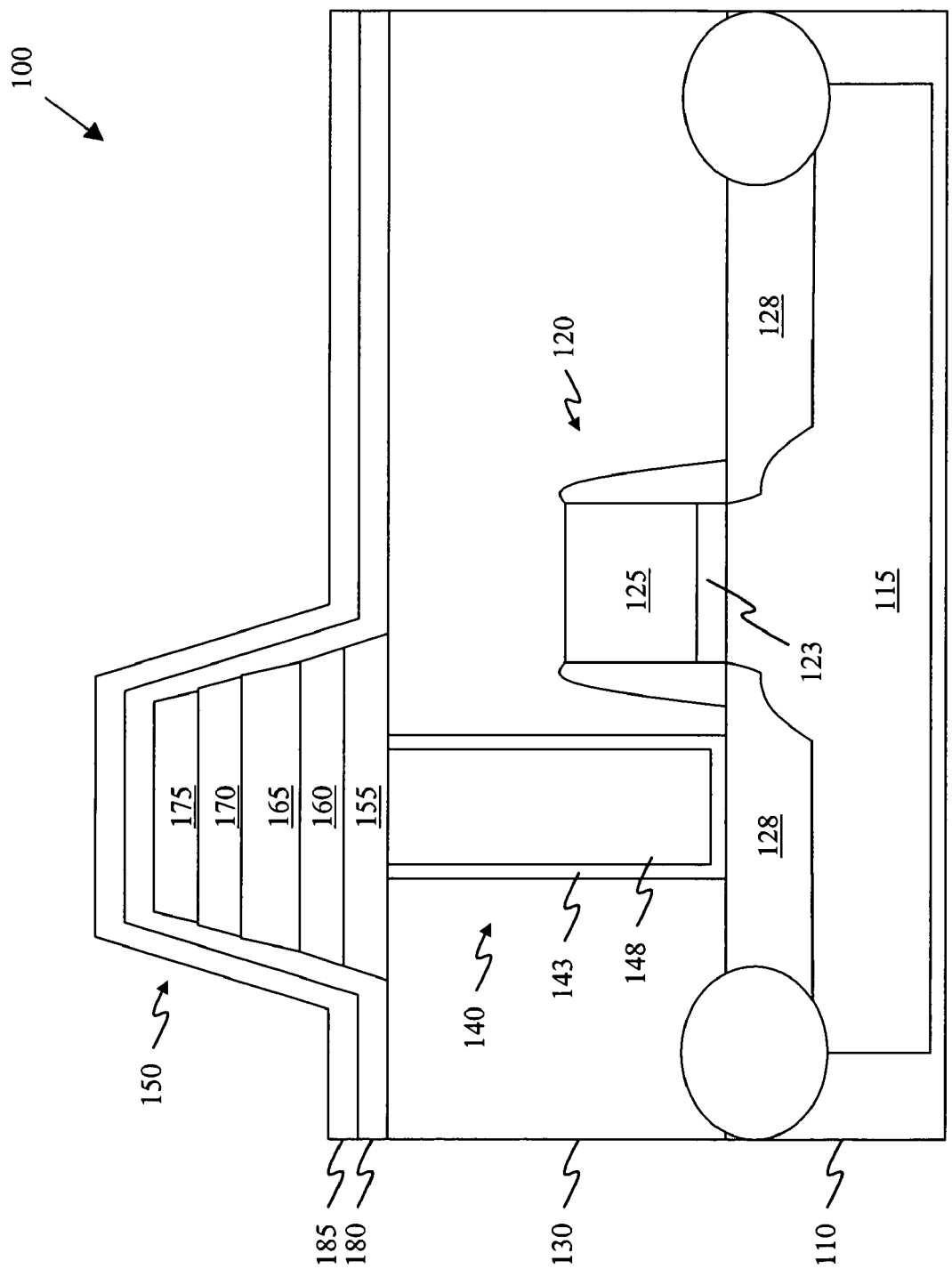
FIG. 1 illustrates a cross-sectional view of one embodiment of a ferroelectric random access memory (FeRAM) device constructed according to the principles of the present invention.

Referring initially to FIG. 1, illustrated is a cross-sectional view of one embodiment of a ferroelectric random access memory (FeRAM) device 100 constructed according to the principles of the present invention. In the embodiment illustrated in FIG. 1, the FeRAM 100 includes a substrate 110. Located within the substrate 110 in the embodiment of FIG. 1 is a well region 115. Additionally located over the substrate 110 and well region 115 is a transistor 120.

The transistor 120 illustrated in FIG. 1 includes a gate oxide 123 located over the substrate 110, as well as a gate electrode 125 located over the gate oxide 123. Flanking both sides of the gate electrode 125 and gate oxide 123 of the transistor 120 may be gate sidewall spacers. The transistor 120 illustrated in FIG. 1 further includes conventional source/drain regions 128 located within the substrate 110. The source/drain regions 128, as is common, may each include a lightly doped extension implant as well as a higher doped source/drain implant.

Located over the transistor 120 is a dielectric layer 130. The dielectric layer 130 may be any insulative material known for use in a semiconductor device, however, in the particular embodiment illustrated in FIG. 1 the dielectric layer 130 is an interlevel dielectric layer. Located within the dielectric layer 130 is an interconnect 140. The interconnect 140, as is common in the semiconductor art, includes a barrier layer 143 and a conductive plug 148. In the particular embodiment of FIG. 1 the conductive plug 148 comprises tungsten and the barrier layer 143 comprises a Ti/TiN stack. Nonetheless, other materials could be used. The interconnect 140 optimally contacts the drain region of the source/drain regions 128.

Advantageously located over the transistor 120 and contacting the interconnect 140 is a ferroelectric capacitor 150. The ferroelectric capacitor 150 in the embodiment of FIG. 1 includes a first protective layer 155, a first electrode layer 160 located over the first protective layer 155, a ferroelectric dielectric layer 165 located over the first electrode layer 160, a second electrode layer 170 located over the ferroelectric dielectric layer 165 and a second protective layer 175 located over the second electrode layer 170. Other layers may or may not comprise the ferroelectric capacitor 150. Similarly, a ferroelectric capacitor 150 manufactured in accordance with the present invention may or may not have all the layers depicted in FIG. 1. Additionally, diffusion barrier layers 180, 185, may be blanket deposited over the entire surface of the ferroelectric capacitor 150.

Unique to the present invention, the ferroelectric dielectric layer 165, which may comprise any known or hereafter discovered ferroelectric dielectric material, is substantially planar and thereby typically has an average surface roughness of less than about 4 nm. In an exemplary embodiment, the ferroelectric dielectric layer 165 has an average surface roughness of less than about 0.5 nm, and preferably less than about 0.1 nm. As the ferroelectric dielectric material commonly comprises lead zirconate titanate (PZT) or strontium bismuth tantalate (SBT), which each have inherent surface average roughness values of greater than 4 nm, the surface roughness values obtained by the present invention are exemplary. The surface roughness values achieved by the present invention are typically only attainable using the unique method of manufacture disclosed herein.

Also unique to the present invention as a result of the substantially planar ferroelectric dielectric layer 165, the ferroelectric capacitor 150 does not experience leakage between the first and second electrode layers 160, 170. For instance, a 40 nm thick ferroelectric dielectric layer 165 having an average surface roughness of greater than about 4 nm or a maximum surface roughness of greater than about 40 nm would provide a leakage path between the first and second electrode layers 160, 170, resulting in a short in the ferroelectric capacitor 150. Additionally, the substantially planar ferroelectric dielectric layer 165 allows the top surface of the ferroelectric capacitor 150 to be substantially planar, which in turn provides a smoother surface for an upper interconnect to contact. This smoother surface allows this upper interconnect to appropriately contact the upper surface of the ferroelectric capacitor 150 without overetching into the upper electrode 170. The overetching exposes the iridium portion of the upper electrode 170, which is known to catalyze the reduction of hydrogen, thus aiding in the degradation of the ferroelectric capacitor 150.

Not only does the substantially planar ferroelectric dielectric layer 165 provide the above-mentioned benefits, it also reduces the complexity of the etch process used to pattern the individual layers of the ferroelectric capacitor 150. Accordingly, the edges of the ferroelectric capacitor 150 are smooth compared to its prior art counterparts. The smooth edges allow the diffusion barrier layers 180, 185, to cover the ferroelectric capacitor 150 better, which in turn substantially prevents hydrogen from reaching the ferroelectric capacitor 150 during back end processing.

Figure 2:
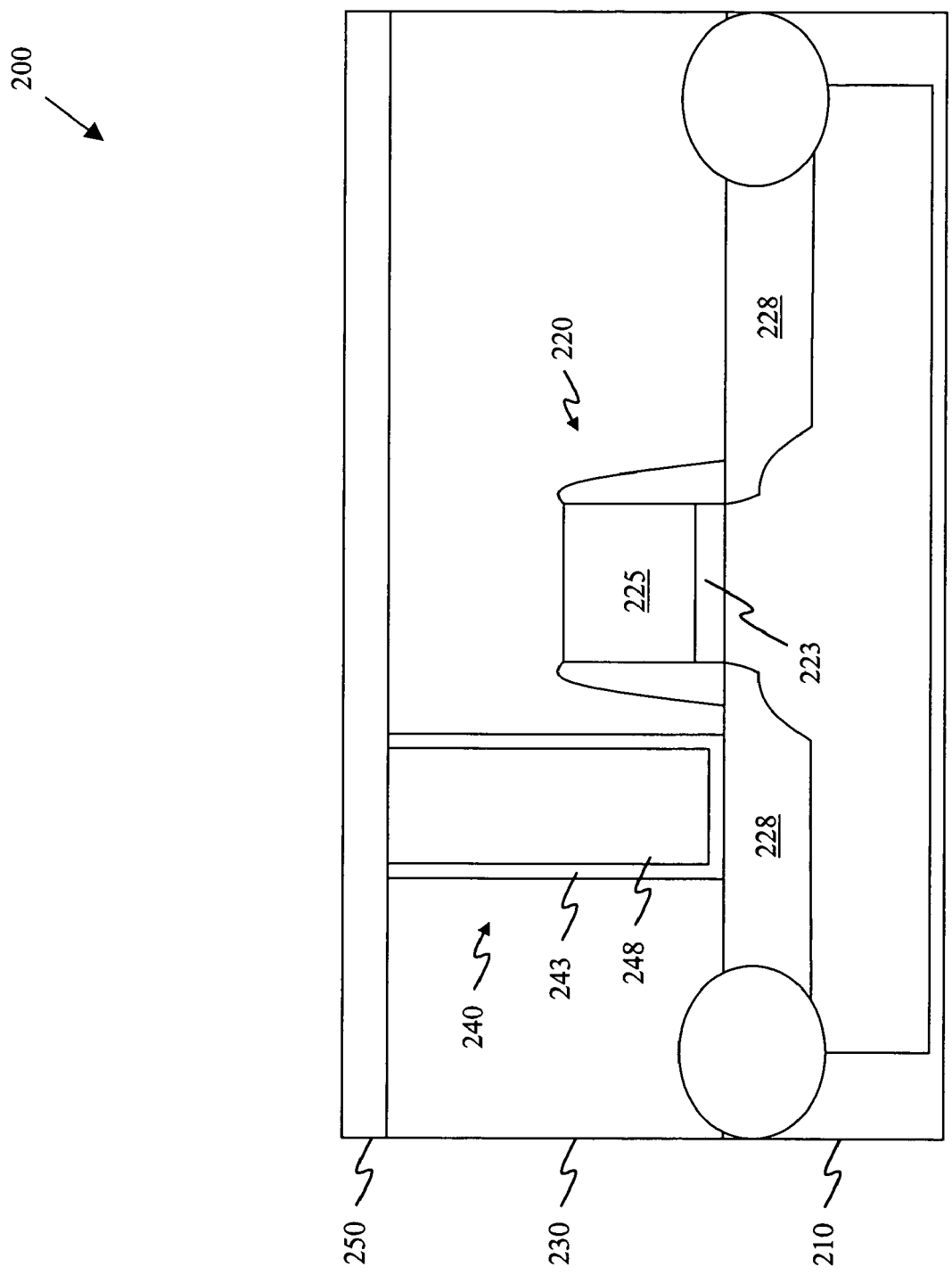
FIG. 2 illustrates a cross-sectional view of a partially completed FeRAM.

Turning now to FIGS. 2–8, illustrated are cross-sectional views of detailed manufacturing steps instructing how one might, in an advantageous embodiment, manufacture a FeRAM similar to the FeRAM 100 depicted in FIG. 1. FIG. 2 illustrates a cross-sectional view of a partially completed FeRAM 200. The partially completed FeRAM 200 of FIG. 2 includes a substrate 210. The substrate 210 may, in an exemplary embodiment, be any layer located in the partially completed FeRAM 200, including a wafer itself or a layer located above the wafer (e.g., epitaxial layer). In the embodiment illustrated in FIG. 2, the substrate 210 is a P-type semiconductor substrate; however, one skilled in the art understands that the substrate 210 could be an N-type substrate without departing from the scope of the present invention.

Located over the substrate 210 is a conventional transistor 220. Basically, the transistor 220 includes a gate dielectric 223 (preferably comprised of silicon dioxide, an oxynitride, a silicon nitride, BST, PZT, a silicate, any other high-k material, or any combination or stack thereof), a gate electrode 225 (preferably comprised of polycrystalline silicon doped either p-type or n-type with a silicide formed on top or a metal such as titanium, tungsten, TiN, tantalum, TaN), and side wall insulators (preferably comprised of an oxide, a nitride, an oxynitride, or a combination or stack thereof). In general the generic terms oxide, nitride and oxynitride refer to silicon oxide, silicon nitride and silicon oxy-nitride. The term "oxide" may, in general, include doped oxides as well as boron and/or phosphorous doped silicon oxide. Source/drain regions 228 are preferably implanted using conventional dopants and processing conditions. Lightly doped drain extensions as well as pocket implants may also be utilized. In addition, the source/drain regions 228 may be silicided (preferably with titanium, cobalt, nickel, tungsten or other conventional silicide material).

A dielectric layer 230 is formed over the entire substrate 210 and over the transistor 220. The dielectric layer 230 is, preferably, comprised of an oxide, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, Teflon, low-K polymer (possibly porous), aerogel, xerogel, BLACK DIAMOND, HSQ, or any other porous glass material), or a combination or stack thereof. Other known materials could, nonetheless, be used.

Located within the dielectric layer 230 is an interconnect 240. To form the interconnect 240 the dielectric layer 230 is patterned and etched so as to form an opening for contact to the substrate 210. This opening is filled with one or more conductive materials, such as a conductive plug 248 (preferably comprised of a metal such as tungsten, molybdenum, titanium, titanium nitride, tantalum nitride, metal silicide such as Ti, Ni or Co, copper or doped polysilicon). A barrier layer 243 may or may not be formed between the conductive plug 248 and dielectric layer 230. While the barrier layer 243 may comprise a multitude of different materials, the barrier layer 243 of FIG. 1 is, preferably, comprised of Ti, TiN, TaSiN, Ta, TaN, TiSiN, a stack thereof, or any other conventional barrier material. Preferably, the interconnect 240 will be formed so as to land on the silicided regions of the source/drain regions 228.

Optionally located over the dielectric layer 230 is a first protective layer 250. The first protective layer 250 may or may not be formed depending on whether the interconnect 240 needs to be protected during subsequent processing of the capacitor dielectric. If formed, the first protective layer 250 is, preferably, comprised of TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material. The thickness of this layer is, preferably, on the order of 60 nm, however, it may range from about 50 nm to about 100 nm, or outside that range, without departing from the scope of the present invention. In the future, scaling the via size will allow scaling of the first protective layer 250 as well.

The preferred deposition technique for the first protective layer 250 is reactive sputter deposition using Ar+$N_2$ or Ar+$NH_3$. It should be noted that Ar is the standard inert gas used for sputter deposition or physical etching based on cost and performance. It is possible to use other inert gases instead of Ar for these applications throughout the process described in this document. Other deposition techniques that might be used include chemical vapor deposition (CVD) or plasma enhanced CVD (PECVD). CVD of nitrides actually results in carbo-oxy-nitrides especially when metalorganic precursors are used and this is also acceptable in many cases. For the preferred tungsten contact it is desirable to deposit a bilayer diffusion barrier. First, CVD TiN (40 nm is preferred) is deposited followed by PVD TiAlN (30 nm preferred). Even more preferred would be CVD or PECVD deposition of TiAlN (about 60 nm). The preferred proportion of aluminum in TiAlN is around 30–60% Al and 40–50% is more preferred in order to have improved oxidation resistance. A better first protective layer 250 (such as the one of an embodiment of the instant invention) will, in general, allow the oxygen stable bottom electrode material to be thinner or a higher process temperature to be used.

Figure 3:
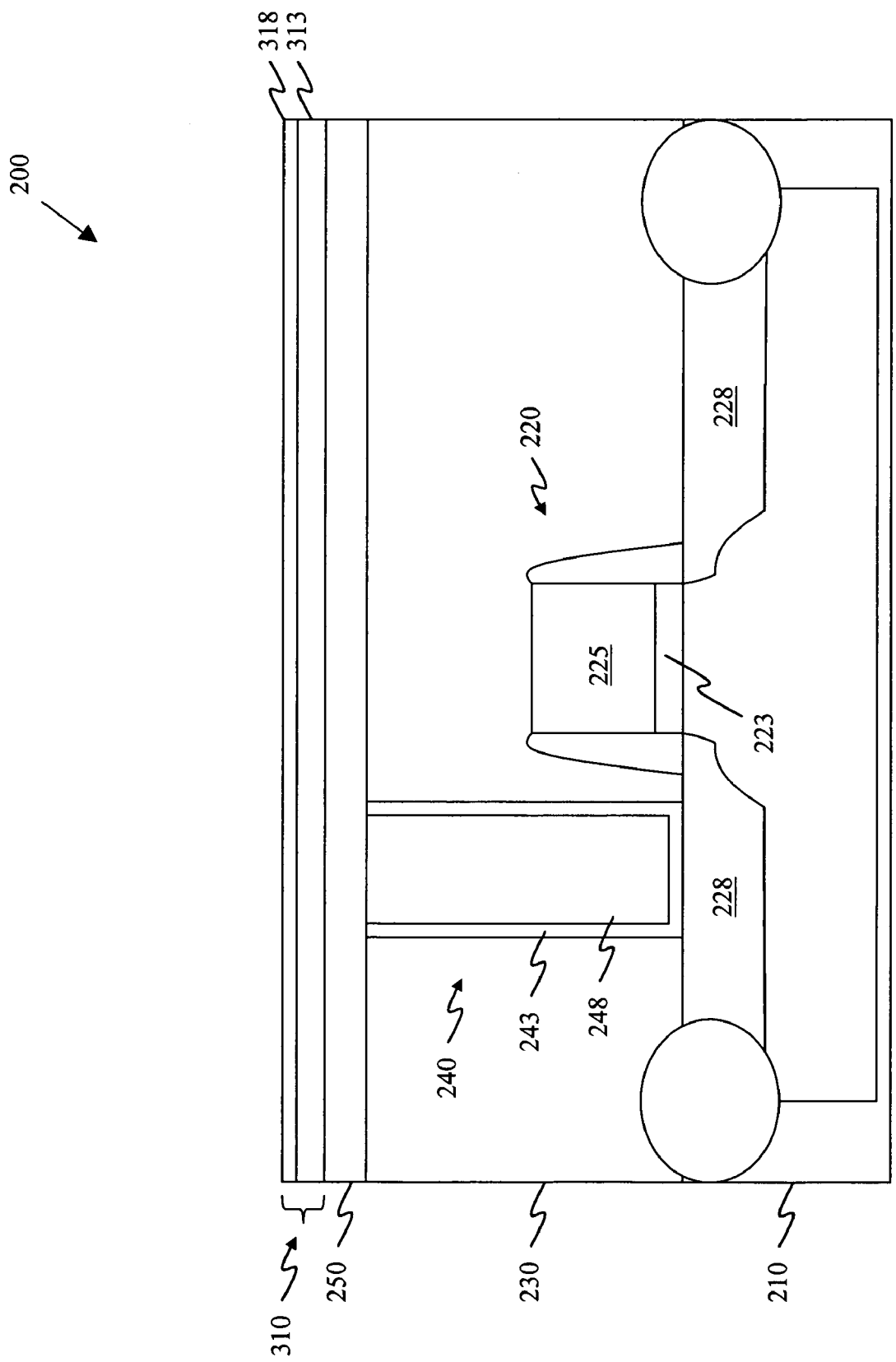
FIG. 3 illustrates a cross-sectional view of the partially completed FeRAM of FIG. 2 after forming a first electrode layer over the optional first protective layer.

Turning now to FIG. 3, illustrated is a cross-sectional view of the partially completed FeRAM 200 of FIG. 2 after forming a first electrode layer 310 over the optional first protective layer 250. The first electrode layer 310 may be either formed on the first protective layer 250 or directly on the dielectric layer 230 so as to make electrical connection with the underlying contact structure. Preferably, the first electrode layer 310 is around about 25–100 nm thick, is stable in oxygen, and is comprised of a noble metal or conductive oxide such as iridium, iridium oxide, Pt, Pd, $PdO_x$, Au, Ru, $RuO_x$, Rh, $RhO_x$, $LaSrCoO_3$, $(Ba, Sr)RuO_3$, $LaNiO_3$ or any stack or combination thereof.

For any electrode using noble metals, it is advantageous, from a cost and ease of integration standpoint, to use layers which are as thin as possible. The preferred first electrode layer 310 for a PZT capacitor dielectric is either about 50 nm Ir or a stack comprised of about 30 nm $IrO_x$ 318 and about 20 nm Ir 313, as shown in FIG. 3. The Ir layer 313 is preferably formed by sputter deposition and the $IrO_x$ layer 318 is preferably formed by reactive sputter deposition ($Ar+O_2$) or oxidation of the Ir layer 313. Lower ferroelectric deposition temperatures might allow even thinner electrodes, which would be preferred. The preferred deposition technique for these layers is sputter or reactive sputter deposition or chemical vapor deposition.

In order to control the stress of the first electrode layer 310, a post bottom electrode anneal may be performed for stress relaxation and/or to improve the microstructure/stability of the first electrode layer 310. Typical anneal conditions are 400–600° C. for 2–10 min in oxygen or inert gas mixture. This anneal may be performed at any time after the formation of the first electrode layer 310, but preferably prior to the formation of subsequent layers.

It should be noted that in some specific devices the first electrode layer 310 is quite rough when formed. In these devices, in accordance with the principles of the present invention, the first electrode layer 310 may be planarized to form a planarized first electrode layer. As will be discussed further below, a post planarization clean may be used to clean any residue from the planarized first electrode layer 310 prior to forming the ferroelectric dielectric layer 410 (FIG. 4).

Figure 4:
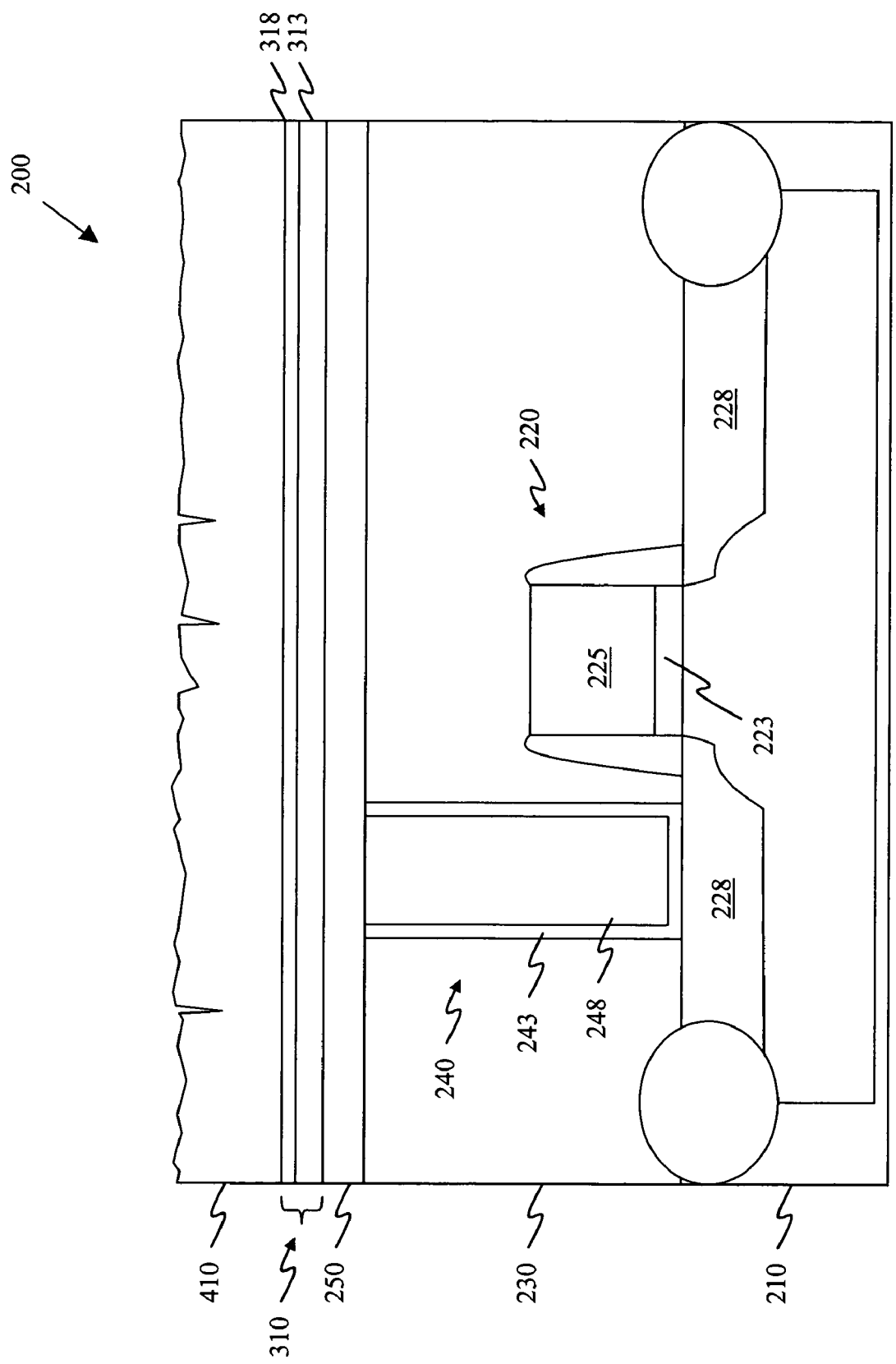
FIG. 4 illustrates a cross-sectional view of the partially completed FeRAM of FIG. 3 after forming a ferroelectric dielectric layer over the first electrode layer.
Figure 5:
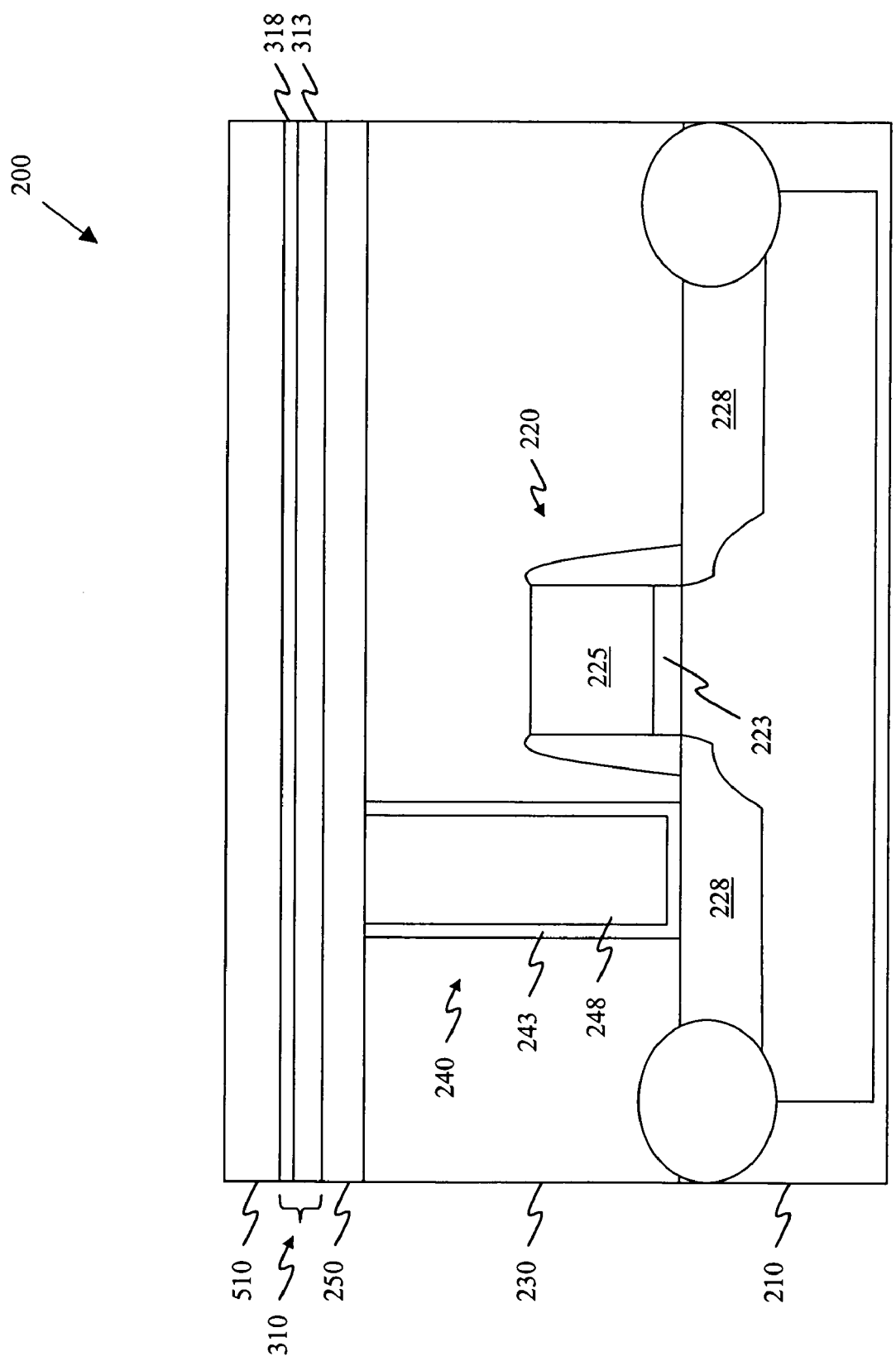
FIG. 5 illustrates a cross-sectional view of the partially completed FeRAM of FIG. 4 after planarizing the ferroelectric dielectric layer to form a planarized ferroelectric dielectric layer.

Turning now to FIG. 4, illustrated is a cross-sectional view of the partially completed FeRAM 200 of FIG. 3 after forming a ferroelectric dielectric layer 410 over the first electrode layer 310. In the embodiment of FIG. 4, the ferroelectric dielectric layer 410 is formed on the first electrode layer 310. Preferably, the ferroelectric dielectric layer 410 has a thickness ranging from about 150 nm to about 60 nm. Specifically, the ferroelectric dielectric layer 410 should have a thickness of about 40 nm to about 50 nm greater than a desired thickness for the polished ferroelectric dielectric layer 510 (FIG. 5).

The ferroelectric dielectric layer 410 is comprised of a ferroelectric material, such as lead zirconate titanate (PZT); doped PZT with donors (Nb, La, Ta), acceptors (Mn, Co, Fe, Ni, Al), and/or both; PZT doped and alloyed with $SrTiO_3$, $BaTiO_3$ or $CaTiO_3$; strontium bismuth tantalate (SBT) and other layered perovskites such as strontium bismuth niobate tantalate (SBNT); or bismuth titanate; $BaTiO_3$; $PbTiO_3$; or $Bi_2TiO_3$. PZT is the most preferable choice for the ferroelectric dielectric layer 410 because it has the highest polarization and the lowest processing temperature of the aforementioned materials. In addition, the preferred Zr/Ti composition is around 20/80, respectively, in order to obtain good ferroelectric switching properties (large switched polarization and relatively square-looking hysterisis loops). Alternatively Zr/Ti compositions of approximately 65/35 may be preferred to maximize uniformity in capacitor properties. The donor dopant can improve the reliability of the PZT by helping to control the point defect concentrations.

The preferred deposition technique for the ferroelectric dielectric layer 410 is metal organic chemical vapor deposition (MOCVD). MOCVD is preferred especially for thin films (i.e., films less than 100 nm thick). Thin PZT is extremely advantageous in making integration simpler (less material to etch), cheaper (less material to deposit therefore less precursor) and allows lower voltage operation (lower coercive voltage for roughly the same coercive electric field). The ferroelectric dielectric layer 410 can be deposited in either a single crystalline/poly-crystalline state or it can be deposited in an amorphous phase at low temperatures and then crystallized using a post-deposition anneal. This is commonly done for Bi ferroelectric films. The post deposition crystallization anneal can be performed immediately after deposition or after later process steps such as electrode deposition or post capacitor etch anneal. The preferred MOCVD PZT approach results in a poly-crystalline film deposited at temperatures preferably between about 450–600° C. (more preferred between about 500° C. and about 550° C.).

Unfortunately, as shown in FIG. 4, the ferroelectric dielectric layer 410 has an extremely non-planar (rough) surface after its formation. The roughness of the ferroelectric dielectric layer 410 is typically inherent in the MOCVD process used to form the ferroelectric dielectric layer 410. These films tend to grow in islands or 3-dimensional growth leading to high surface roughness. As discussed above, this surface roughness is known to cause serious reliability issues in FeRAM devices.

Turning now to FIG. 5, illustrated is a cross-sectional view of the partially completed FeRAM 200 of FIG. 4 after planarizing the ferroelectric dielectric layer 410 to form a planarized ferroelectric dielectric layer 510. The planarized ferroelectric dielectric layer 510 in the embodiment of FIG. 5 is substantially planar. For example, the planarized ferroelectric dielectric layer 510 has an average surface roughness of less than about 4 nm, preferably an average surface roughness of less than about 1 nm, and exemplary an average surface roughness of less than about 0.5 nm. In an exemplary embodiment the planarized ferroelectric dielectric layer 510 has a thickness ranging from about 100 nm to about 20 nm. Other thicknesses are, however, within the scope of the present invention.

The ferroelectric dielectric layer 410 may be planarized using a number of different processes. For example, planarization may be performed using a blanket etchback process, a chemical mechanical polishing (CMP) process or another similar process. It is presently believed that the CMP process would provide the best planarity, however, the other processes are still within the scope of the present invention. Regardless of the technique used, it is beneficial for the planarization process to remove a substantial portion of the inherent surface roughness of the ferroelectric dielectric layer 410.

The CMP process, if used, would likely employ a soft pad and either no solids or a low solid content in the slurry. In the case of no solids, the pad itself and particles released from the surface will act as the abrasive. Slurry solids if used could be selected from particles such as alumina, silica or ceria. The slurry could be either acidic or basic, although highly acidic solutions containing fluoride would not generally be desirable. Chemicals that can be used to promote chemical action by the slurry could be chlorides or phosphates. A high pH solution can also be used to promote chemical activity. Since this process is only for planarization of the PZT layer and does not require stopping on another film then there is no concern with passivation or selectivity to a second film. Using some of these additives may not be compatible with particles such as silica.

After planarizing the ferroelectric dielectric layer 410 to form the planarized ferroelectric dielectric layer 510, the surface of the partially completed FeRAM 200 of FIG. 5 may optionally be subjected to a cleaning step. A phosphoric acid solution could be used for this clean since it slightly etches the planarized ferroelectric dielectric layer 510, and any residues or particles would be undercut and lifted from the surface. A chemistry that etches the planarized ferroelectric dielectric layer 510 at a low rate would be preferred. Several chemistries can be used, such as HF, $NH_4F$, HCl containing solutions and strong bases, and combinations thereof. These solutions would have to be diluted or otherwise modified with solvents and other chemistries to achieve a low etch rate. Another potential solution is phosphoric acid which can have its etch rate modified through the use of dilution and/or temperature.

Figure 6:
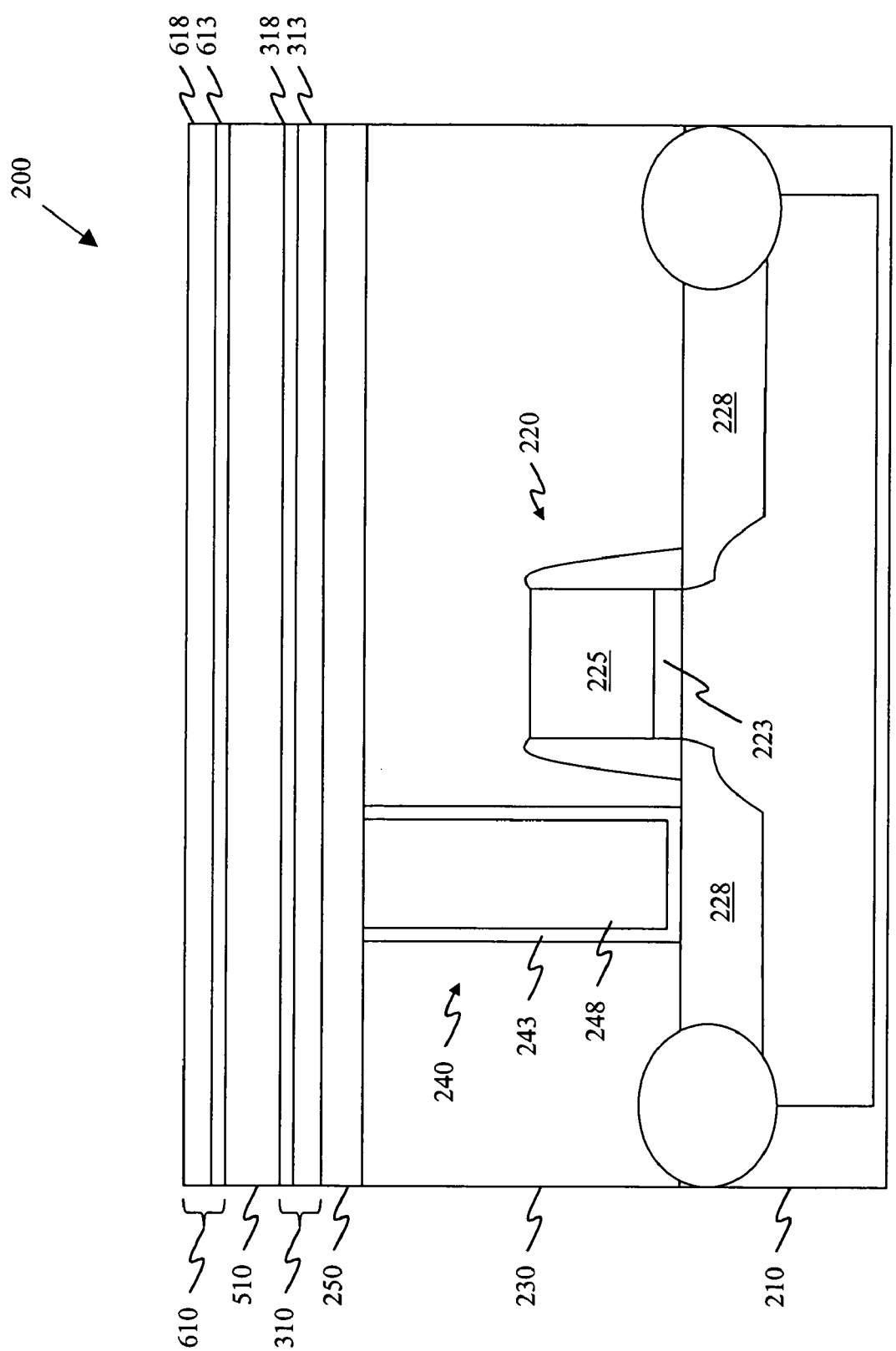
FIG. 6 illustrates a cross-sectional view of the partially completed FeRAM of FIG. 5 after forming a second electrode layer over the planarized ferroelectric dielectric layer.

Turning now to FIG. 6, illustrated is a cross-sectional view of the partially completed FeRAM 200 of FIG. 5 after forming a second electrode layer 610 over the planarized ferroelectric dielectric layer 510. In this embodiment of the instant invention, the second electrode layer 610 is illustrated as layers 613 and 618. However, the second electrode layer 610 can be implemented in just one layer. Preferably, layer 613 is comprised of iridium oxide (preferably less than 100 nm thick-more preferably less than 50 nm thick) and layer 618 is comprised of iridium (preferably less than 100 nm thick-more preferably less than 50 nm thick). In particular it is advantageous for Pb based ferroelectrics to have a conductive oxide top electrode such as $IrO_x$, $RuO_x$, $RhO_x$, $Pdo_x$, $PtO_x$, $AgO_x$, $(Ba, Sr)RuO_3$, $LaSrCoO_3$, $LaNiO_3$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics.

If the second electrode layer 610 is an oxide, it is advantageous to have a noble metal layer above it in order to maintain low contact resistance between the top metal contact and oxide. For example, it is possible that a TiN layer in contact with $IrO_x$ might form $TiO_2$, which is insulating, during subsequent thermal processes. For any electrode using an expensive noble metal such as Pt, Ru, Pd, or Ir, it is advantageous, from a cost and integration standpoint, to use as thin of layer as possible. For PZT electrodes, the preferred second electrode layer 610 is comprised of approximately 10 nm Ir deposited by PVD in Ar on approximately 20 nm $IrO_x$ deposited by reactive PVD in Ar+$O_2$ on top of the planarized ferroelectric dielectric layer 510. $IrO_x$ is preferred to be deposited below about 400° C. in gas mixtures of between about 50% and about 80% $O_2$ with the rest argon with a relatively low sputter power and hence slow deposition rate (preferred to be less than about 20 nm/min). It is possible to anneal the second electrode layer 610 prior to deposition of second protective layer 710 (FIG. 7) in order to control the stress in the second electrode layer 610. For example, sputter deposited electrodes will typically be subjected to compressive stress while, the stress in annealed electrodes will be tensile.

In one exemplary embodiment of the present invention, the second electrode layer 610 is planarized after formation thereof, thereby providing a planarized second electrode layer 610. While the second electrode layer 610 does not inherently have the same amount of surface roughness as the ferroelectric dielectric layer 410, it nonetheless, would benefit from the planarizing process. It may be advantageous to planarize at least a portion of only the second electrode layer 610 rather than planarizing the ferroelectric dielectric layer 410. For example, the present invention may want to planarize only after depositing layer 618 or alternatively layer 613. Depending on the location of planarization the present invention would accordingly deposit a thicker film with a goal of final thickness of 20 nm for $IrO_2$ and 10 nm for Ir. The preferred case would be to planarize after layer 613 in this scenario.

The second electrode layer 610 may be planarized using a similar technique as used to planarize the ferroelectric dielectric layer 410. Similarly, an optional post CMP clean could be used to clean the surface of the planarized second electrode layer 610. This post CMP clean can be very aggressive since the Ir and $IrO_x$ surfaces are very inert. The clean would be targeted at removal of slurry residues, e.g., HF or fluorides for silica slurries or phosphoric acid solutions for alumina slurries.

Figure 7:
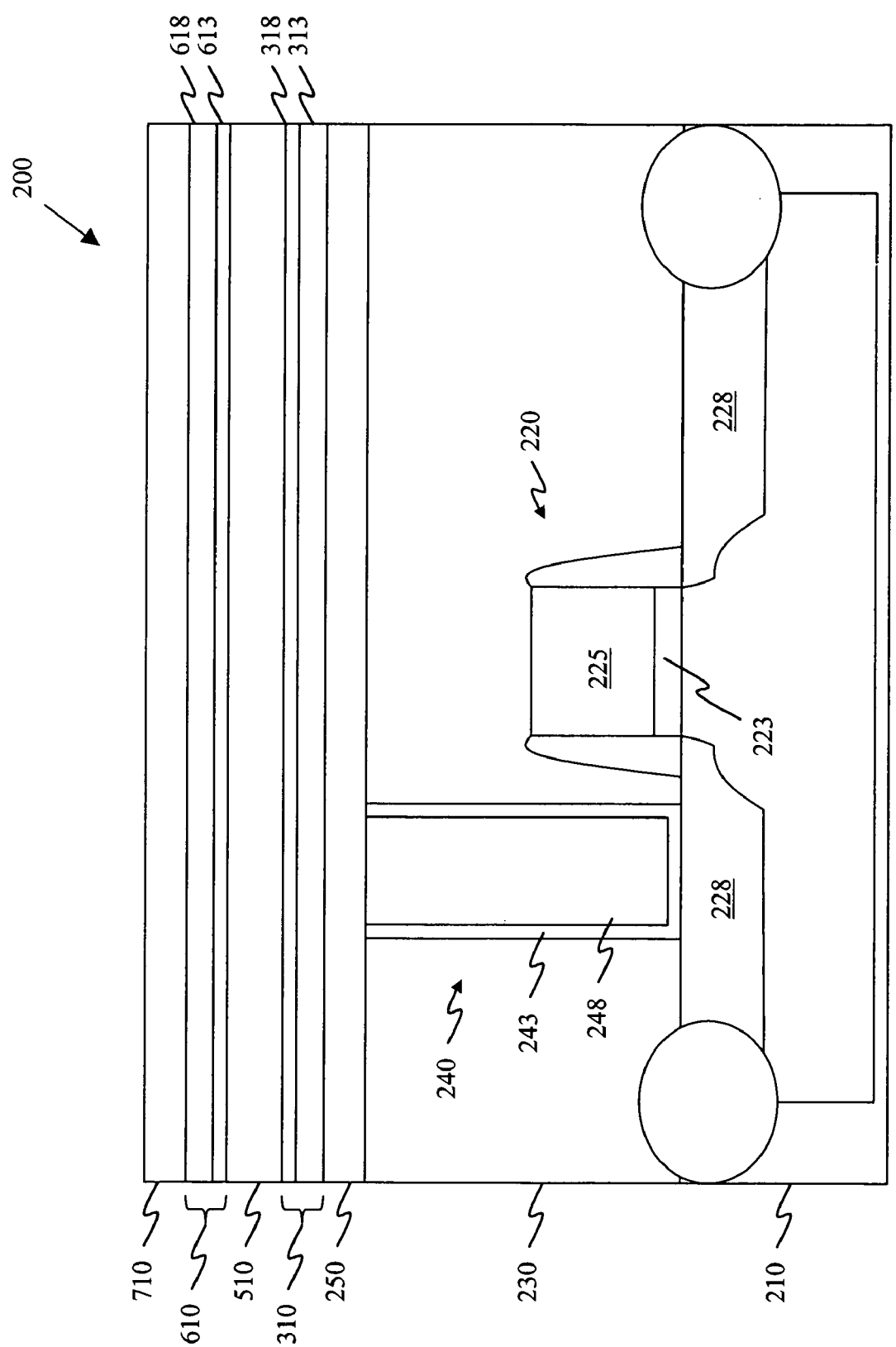
FIG. 7 illustrates a cross-sectional view of the partially completed FeRAM of FIG. 6 after forming a second protective layer over the second electrode layer.

Turning now to FIG. 7, illustrated is a cross-sectional view of the partially completed FeRAM 200 of FIG. 6 after forming a second protective layer 710 over the second electrode layer 610. Preferably, the second protective layer 710 is comprised of a material which is thick enough so as to retain its integrity during a subsequent etch process. The second protective layer 710 is, preferably, around about 50 to about 500 nm thick (more preferably around about 100 to about 300 nm thick—most preferably around about 200 nm thick) and is comprised of TiAlN, TiN, Ti, $TiO_2$, Al, $AlO_x$, AlN, TiAl, $TiAlO_x$, Ta, $TaO_x$, TaN, Cr, CrN, $CrO_x$, Zr, $ZrO_x$, ZrN, Hf, HfN, $HfO_x$, silicon oxide, low-k dielectric, or any stack or combination thereof. An example of a second protective layer 710 is 300 nm of PECVD deposited $SiO_2$ on 50 nm of sputter deposited TiAlN or TiN. The second protective layer 710 thickness is controlled by the etch process and the relative etch rates of the various materials, the thicknesses of the etched layers, the amount of overetch required, and the desired remaining second protective layer 710 thickness after etching all of the layers. The second protective layer 710 may or may not be removed after the etching of the capacitor stack. If the second protective layer 710 is not removed, then it is preferable to form it of a conductive material. However, a non-conductive or semiconductive material may be used, but the interconnection to the top electrode of the capacitor should preferably be formed through this layer so as to make direct connection to the top electrode. Similar to the planarized ferroelectric dielectric layer 510 and second electrode layer 610, the second protective layer 710 may be polished and cleaned.

Figure 8:
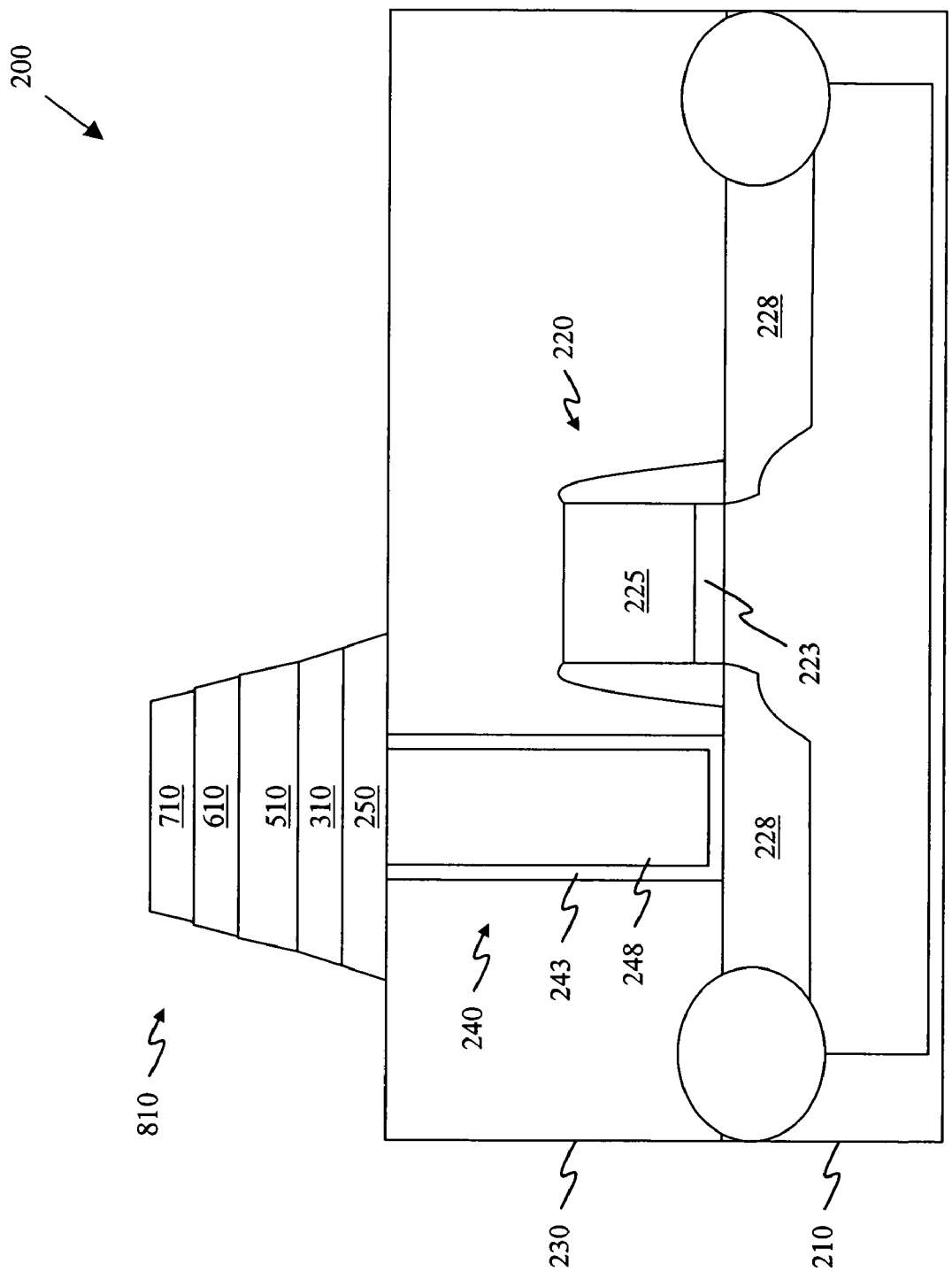
FIG. 8 illustrates a cross-sectional view of the partially completed FeRAM of FIG. 7 after patterning the first protective layer, the first electrode layer, the planarized ferroelectric dielectric layer, the second electrode layer and the second protective layer to form a completed ferroelectric capacitor.

Turning now to FIG. 8, illustrated is a cross-sectional view of the partially completed FeRAM 200 of FIG. 7 after patterning the first protective layer 250, the first electrode layer 310, the planarized ferroelectric dielectric layer 510, the second electrode layer 610 and the second protective layer 710 to form a completed ferroelectric capacitor 810. It is preferred to perform the pattern and etch process for the completed ferroelectric capacitor 810 with only one lithography step. This is not only cheaper, but also allows the cell size to be smaller by eliminating misalignment tolerances which are necessary if more than one lithography step is used.

The etch process is a dirty process and hence it is likely that the etch tool and the frontside, edge and backside of the wafers will have FeRAM contamination or have etch residues with FeRAM contamination. It is, therefore, often necessary to clean the frontside of the wafer and chemically remove etch residues and possibly remove a thin layer of damaged PZT. This post-capacitor-etch wet-clean may, with some etch conditions and chemistries, be as simple as a deionized water (DI water or DIW) clean (tank soak with or without megasonic followed by a spin rinse dry) or the tank etch might be acid-based in order to improve the clean or remove more damage.

The sidewalls of the completed ferroelectric capacitor 810 are, preferably, fairly steep. A sidewall diffusion barrier is, preferably, formed on the completed ferroelectric capacitor 810 prior to the formation of another interlevel dielectric thereover. The sidewall diffusion barrier is important because it allows for the misalignment of the interconnect without shorting the capacitor, it protects the capacitor from the diffusion of most substances into the capacitor, and it protects the rest of the structures from the out-diffusion of substances from the capacitor.

The sidewall diffusion barrier often comprises two layers, but the sidewall diffusion barrier may be comprised of more or fewer layers and stay within the scope of the present invention. Preferably, the first layer is around 30 nm thick and is comprised of $AlO_x$, $Ta_2O_5$, AlN, $TiO_2$, $ZrO_2$, $HfO_2$, or any stack or combination thereof; and the second layer is around 30 nm thick and is comprised of silicon nitride, AlN, or any stack or combination thereof. The preferred process for depositing these layers is MOCVD under conditions with minimal free hydrogen (e.g., enough oxygen such that $H_2O$ is formed rather than $H_2$). It is also possible to use a plasma enhanced CVD or MOCVD process. Alternatively reactive sputter deposition can be used with either $Ar+O_2$ (for oxides), $Ar+N_2$ (for nitrides) or $Ar+O_2+N_2$ (for oxy-nitrides). For the preferred embodiment listed here, the first layer is used as a Pb and H diffusion barrier while the second layer is used as a contact etch stop. Subsequent to the formation of the first and second diffusion barrier layers the manufacturing process would continue resulting in a device similar to the FeRAM 100 illustrated in FIG. 1.

Figure 9:
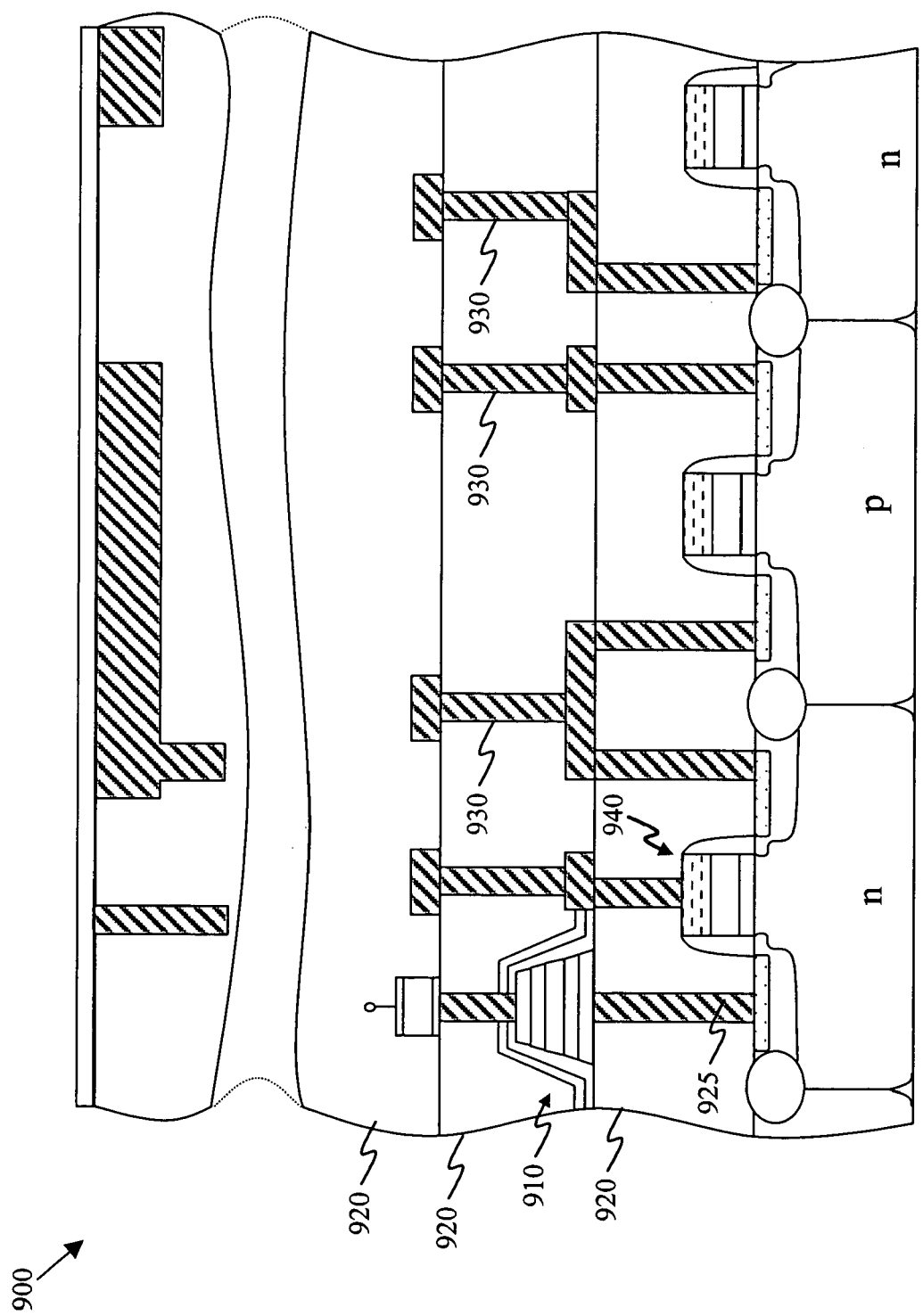
FIG. 9 illustrates an exemplary cross-sectional view of a conventional integrated circuit (IC) incorporating a FeRAM constructed according to the principles of the present invention.

Referring finally to FIG. 9, illustrated is an exemplary cross-sectional view of a conventional integrated circuit (IC) 900 incorporating a ferroelectric capacitor 910 constructed according to the principles of the present invention. The IC 900 may include devices, such as transistors used to form CMOS devices, BiCMOS devices, Bipolar devices, as well as capacitors or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes the ferroelectric capacitor 910 having dielectric layers 920 located thereunder and thereover. Additionally, interconnect structures 930 are located within the dielectric layers 920 to interconnect various devices. Specifically, interconnect structure 925 connects the ferroelectric capacitor 910 to source/drain regions of the transistor 940, thus, forming the operational integrated circuit 900.

Although the present invention has been described in detail, those skilled in the art should understand that they can make various changes, substitutions and alterations herein without departing from the spirit and scope of the invention in its broadest form.

What is claimed is:

1. A method for manufacturing a ferroelectric capacitor, comprising:
    forming a first electrode layer;
    forming a ferroelectric dielectric layer over the first electrode layer;
    planarizing the ferroelectric dielectric layer to form a planarized ferroelectric dielectric layer;
    forming a second electrode layer over the planarized ferroelectric dielectric layer; and
    cleaning the planarized ferroelectric dielectric layer prior to forming the second electrode layer.

2. The method as recited in claim 1 wherein planarizing the ferroelectric dielectric layer includes planarizing the ferroelectric dielectric layer using a chemical mechanical polishing process until it is substantially planar.

3. The method as recited in claim 2 wherein the substantially planar ferroelectric dielectric layer has an average surface roughness of less than about 1 nm.

4. The method as recited in claim 3 wherein the substantially planar ferroelectric dielectric layer has an average surface roughness of less than about 0.5 nm.

5. The method as recited in claim 1 wherein the ferroelectric dielectric layer comprises lead zirconate titanate (PZT) or strontium bismuth tantalate (SBT).

6. The method as recited in claim 1 further including forming a first protective layer between the first electrode layer and a conductive plug and forming a second protective layer over the second electrode layer.

7. The method as recited in claim 6 further including planarizing at least a portion of the second electrode layer to form a planarized second electrode layer prior to forming the second protective layer.

8. The method as recited in claim 7 further including cleaning the planarized second electrode layer prior to forming the second protective layer.

9. The method as recited in claim 1 further including planarizing at least a portion of the first electrode layer to form a planarized first electrode layer prior to forming the ferroelectric dielectric layer.

10. The method as recited in claim 9 further including cleaning the planarized first electrode layer prior to forming the ferroelectric dielectric layer.

11. The method as recited in claim 1 wherein the ferroelectric dielectric layer has a thickness ranging from about 150 nm to about 20 nm and the planarized ferroelectric dielectric layer has a thickness ranging from about 100 nm to about 20 nm.

12. The method as recited in claim 1 further including patterning the first electrode layer, the ferroelectric dielectric layer, and the second electrode layer to form a patterned ferroelectric capacitor.

13. A method for manufacturing a ferroelectric random access memory (FeRAM) device, comprising:
    forming a transistor having source/drain regions over a semiconductor substrate;
    forming an interlevel dielectric layer over the transistor, the interlevel dielectric layer having a conductive plug therein contacting at least one of the source/drain regions; and
    forming a ferroelectric capacitor over the interlevel dielectric layer and contacting the conductive plug, including;
        forming a first electrode layer over the conductive plug;
        forming a ferroelectric dielectric layer over the first electrode layer;
        planarizing the ferroelectric dielectric layer to form a planarized ferroelectric dielectric layer;
        cleaning the planarized ferroelectric dielectric layer; and
        then, forming a second electrode layer over the planarized ferroelectric dielectric layer.

14. The method as recited in claim 13 wherein planarizing the ferroelectric dielectric layer includes planarizing the ferroelectric dielectric layer using a chemical mechanical polishing process until it is substantially planar.

15. The method as recited in claim 14 wherein the substantially planar ferroelectric dielectric layer has an average surface roughness of less than about 1 nm.

16. The method as recited in claim 15 wherein the substantially planar ferroelectric dielectric layer has an average surface roughness of less than about 0.5 nm.

17. The method as recited in claim 13 wherein the ferroelectric dielectric layer comprises lead zirconate titanate (PZT) or strontium bismuth tantalate (SBT).

18. The method as recited in claim 13 further including forming a first protective layer between the first electrode layer and a conductive plug and forming a second protective layer over the second electrode layer.

19. The method as recited in claim 18 further including planarizing at least a portion of the second electrode layer to form a planarized second electrode layer prior to forming the second protective layer.

20. The method as recited in claim 19 further including cleaning the planarized second electrode layer prior to forming the second protective layer.

21. The method as recited in claim 13 further including planarizing at least a portion of the first electrode layer to form a planarized first electrode layer prior to forming the ferroelectric dielectric layer.

22. The method as recited in claim 21 further including cleaning the planarized first electrode layer prior to forming the ferroelectric dielectric layer.

23. The method as recited in claim 13 wherein the ferroelectric dielectric layer has a thickness ranging from about 150 nm to about 60 nm and the planarized ferroelectric dielectric layer has a thickness ranging from about 100 nm to about 20 nm.

24. The method as recited in claim 13 further including patterning the first electrode layer, the ferroelectric dielectric layer, and the second electrode layer to form a patterned ferroelectric capacitor.

25. A method for manufacturing a ferroelectric capacitor, comprising:
  forming a first electrode layer;
  forming a ferroelectric dielectric layer over the first electrode layer; and
  forming a second electrode layer over the ferroelectric dielectric layer, wherein at least one of the first electrode layer, ferroelectric dielectric layer or second electrode layer is planarized to form a planarized first electrode layer, planarized ferroelectric dielectric layer or planarized second electrode layer, respectively; and wherein the ferroelectric dielectric layer is planarized and then cleaned prior to forming the second electrode layer.

26. The method as recited in claim 25 wherein the second electrode layer is planarized and cleaned prior to forming an additional layer thereon.

* * * * *